US009070872B2

(12) United States Patent
Huo et al.

(10) Patent No.: US 9,070,872 B2
(45) Date of Patent: Jun. 30, 2015

(54) METHOD FOR MANUFACTURING THREE-DIMENSIONAL SEMICONDUCTOR MEMORY DEVICE

(75) Inventors: Zongliang Huo, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 178 days.

(21) Appl. No.: 13/880,641

(22) PCT Filed: Jun. 30, 2011

(86) PCT No.: PCT/CN2011/076695
§ 371 (c)(1),
(2), (4) Date: Apr. 19, 2013

(87) PCT Pub. No.: WO2012/088862
PCT Pub. Date: Jul. 5, 2012

(65) Prior Publication Data
US 2013/0203227 A1    Aug. 8, 2013

(30) Foreign Application Priority Data

Dec. 29, 2010  (CN) .......................... 2010 1 0611894

(51) Int. Cl.
*H01L 21/336* (2006.01)
*H01L 45/00* (2006.01)
*H01L 27/06* (2006.01)
(Continued)

(52) U.S. Cl.
CPC ........ *H01L 45/1206* (2013.01); *H01L 27/0688* (2013.01); *H01L 27/101* (2013.01); *H01L 45/04* (2013.01); *H01L 45/14* (2013.01);
(Continued)

(58) Field of Classification Search
CPC .................... H01L 27/11514; H01L 27/11568
USPC .......................................................... 438/238
See application file for complete search history.

(56) References Cited

U.S. PATENT DOCUMENTS

2008/0175032 A1*  7/2008  Tanaka et al. ................... 365/51
2009/0154227 A1*  6/2009  Philipp et al. ................. 365/163
2011/0065270 A1*  3/2011  Shim et al. .................... 438/589

FOREIGN PATENT DOCUMENTS

CN          101779287 A      7/2010

OTHER PUBLICATIONS

International Search Report for PCT Application No. PCT/CN2011/076695, dated Oct. 20, 2011, 3 pages.
Written Opinion for International Search Report for PCT Application No. PCT/CN2011/076695, dated Oct. 20, 2011, 4 pages.

(Continued)

*Primary Examiner* — Mohammad Islam
*Assistant Examiner* — Ankush Singal
(74) *Attorney, Agent, or Firm* — Westman, Champlin & Koehler, P.A.

(57) ABSTRACT

The present disclosure provides a method for manufacturing a three-dimensional semiconductor memory device. In the method, a storage array is divided into a plurality of storage sub-arrays. As a result, a respective via of each storage sub-array can be etched respectively, which is different from the prior art, where a via for a bottom electrode of a plurality of layers of resistive cells is etched at one time. The vias are filled with metal so that storage sub-arrays are connected with each other. The method for manufacturing the three-dimensional semiconductor memory device according to the present disclosure can substantially reduce process complexity and difficulty of etching process in high-density integration, and also improve a number of layers of the resistive cells integrated in the storage array.

9 Claims, 7 Drawing Sheets

(51) Int. Cl.
   *H01L 27/10* (2006.01)
   *H01L 27/24* (2006.01)
(52) U.S. Cl.
   CPC ........... *H01L 45/16* (2013.01); *H01L 27/2436* (2013.01); *H01L 27/249* (2013.01)

(56) References Cited

OTHER PUBLICATIONS

First Chinese Office Action for Chinese Application No. 201010611894.X, dated Jul. 11, 2013, 10 pages.

* cited by examiner

CROSS-SECTIONAL VIEW ALONG BIT-LINE DIRECTION

CROSS-SECTIONAL VIEW ALONG WORD-LINE DIRECTION

| SiO 50nm/Metal 50nm (per R-Unit) | TOP CD:100nm Bottom CD:30nm | | TOP CD:100nm Bottom CD:0nm | |
|---|---|---|---|---|
| Angle | Stack Height | # of Layer | Stack Height | # of Layer |
| 85° | 400nm | 4 | 571nm | 5 |

US 9,070,872 B2

METHOD FOR MANUFACTURING THREE-DIMENSIONAL SEMICONDUCTOR MEMORY DEVICE

This application is a National Phase application of, and claims priority to, PCT Application No. PCT/CN2011/076695, filed on Jun. 30, 2011, entitled "METHOD FOR MANUFACTURING THREE-DIMENSIONAL SEMICONDUCTOR MEMORY DEVICE", which claimed priority to Chinese Application No. 201010611894.X, filed on Dec. 29, 2010. Both the PCT Application and Chinese Application are incorporated herein by reference in their entireties.

TECHNICAL FIELD

The present disclosure relates to the field of microelectronics technology, and in particular, to a method for manufacturing a three-dimensional semiconductor memory device.

BACKGROUND

Semiconductor storage technology is one of key technologies in the field of microelectronics technology. As focus of information technology turns from networks and computers to storage, research of storage technology becomes an important direction of information technology research. Current research of storage technology mainly focuses on high-density and high-performance non-volatile flash technology. As device sizes continuously decrease, conventional FLASH technology encounters great difficulties during size scaling, such as crosstalk and low writing speed, etc. As a result, the conventional FLASH technology cannot satisfy requirements of storage technology development of post-20 nm-node. New storage technology is required for high-capacity storage.

Recently, resistive storage technology has attracted attention of many researchers, and has been considered as a key technology of post-20 nm-node. A resistive random access memory utilizes reversible conversions between a high-resistance state and a low-resistance state of storage medium under control of an electrical signal to distinguish two states, as a conventional RRAM does. Alternatively, the two states can also be implemented by resistance change caused by phase change of material under the electrical signal, as a conventional PRAM does. A resistive cell typically comprises a top electrode, a resistive (phase-change) material, and a bottom electrode, which are stacked in sequence. Such a structure has many advantages because it is simple, easy to be manufactured, and compatible with existing CMOS processes. Therefore, three-dimensional integration of resistive cells may facilitate high-density data storage and may be applied in various applications such as Solid State Disk.

Conventional resistive storage technology needs diodes or selection transistors in implementing cell selection, as a 1D1R structure or a 1T1R structure does. A three-dimensional resistive storage is mainly a three-dimensional integration of the two typical storage structures. 1D1R-type three-dimensional resistive memory devices can improve storage density to a certain degree. However, because the diode in the resistive cell typically comprises a PN junction, substantial scaling of resistive cell height is difficult. Meanwhile, during manufacturing of a multi-stack resistive cell, a high temperature is required in an implantation process and a subsequent dopant activation process in forming the PN junction, causing pre-formed cell performance to be affected by later manufacturing processes. This is disadvantageous for reliable operation of the memory device. Therefore, 1T1R-type three-dimensional storage technology exhibits more potential in high-density integration.

FIG. 1 shows a cross-sectional view along a bit-line direction of a 1T1R-type three-dimensional memory structure proposed by the applicant. FIG. 2 shows a cross-sectional view along a word-line direction of the 1T1R-type three-dimensional memory structure proposed by the applicant. As shown in FIG. 1 and FIG. 2, as an example, each vertical storage string comprises a transistor and four resistive cells. This structure achieves high-density integration in comparison with planar-type flash cells and planar-type resistive cells. However, with the emergence of ultra-high-capacity (>Terabit) storage requirement, the structure shown in FIG. 1 encounters great processing challenges in integration of more layers of resistive cells, and thus has difficulties in satisfying the requirement. The resistive cells as shown in FIG. 1 share a common pillar-shape bottom electrode, which is formed by via etching process. The via has an etching depth that is determined by respective thicknesses of layers constituting each resistive cell and a number of the resistive cells. Assuming that the top electrode of the resistive cell has a thickness of 50 nm, and the cells are separated vertically by a space of 50 nm, each resistive cell will be formed with a thickness of 50 nm.

FIG. 3 shows, according to prior art, a comparison between a stack height obtained when the via has a bottom diameter of 30 nm and that obtained when the via has a bottom diameter of 0 nm. The via has a top diameter of 100 nm and an etching angle of 85 degree. As shown in FIG. 3, when the etching angle is 85 degree, only 4~5 layers of resistive cells can be integrated in a stack. Even though an etching angle of 88 degree can be achieved by improving etching process, 14 layers of resistive cells can be integrated at most. Meanwhile, because reduction of bottom diameter of the via will cause the resistance of the bottom electrode to dramatically increase and hollow holes will be easily created in small vias, which will cause open circuit, an actual number of layers of resistive cells that can be integrated are less than the above estimated ones.

Therefore, in the process of manufacturing the three-dimensional semiconductor memory device, the existing etching process cannot achieve a big ratio between depth and diameter of the via, which is a great obstacle of high-density longitudinal integration of three-dimensional resistive (phase-change) cells.

SUMMARY

(1) Technical Problems to be Solved

In order to solve the above-described technical problems of the prior art, the present disclosure provides a method for manufacturing a three-dimensional semiconductor memory device. With the method, storage density of three-dimensional cells can be improved using existing etching processes.

(2) Technical Solution

According to an aspect of the present disclosure, there is provided a method for manufacturing a three-dimensional semiconductor memory device, comprising: step A: forming an access transistor on a substrate; step B: forming a first storage sub-array comprising a plurality of vertical ring-shape resistive cells on the access transistor, comprising: depositing a plurality of isolation layers and a plurality of sacrificing layers, alternatively; etching a via to define a bottom electrode region of the vertical ring-shape resistive cells, the bottom electrode region being connected downward with a drain of the access transistor; depositing a bottom electrode of the first storage sub-array in the via; and depositing an insulation dielectric layer; step C: forming a second storage sub-array comprising a plurality of vertical ring-shape resistive cells on the first storage sub-array, comprising: depositing a plurality of isolation layers and a plurality of sacrificing layers; etching a via to define a bottom electrode region, which extends downward to the bottom electrode of the first storage sub-array; depositing a bottom electrode of the second storage sub-array in the via, wherein the bottom electrode of the second storage sub-array is connected with the bottom electrode of the first storage sub-array; and depositing an insulation dielectric layer.

Optionally, the method may further comprise, after the step C: repeating the step C to form an Nth storage sub-array on an (N−1)th storage sub-array.

Optionally, the method may further comprise, before the step B: for each storage sub-array, determining a number of layers of the vertical ring-shape resistive cells based on a ratio between depth and diameter of the via and a height of each vertical ring-shape resistive cell; and determining a number of the sacrificing layers based on the number of layers of the vertical ring-shape resistive cells.

Optionally, the method may further comprise, in each of the step B and the step C, before depositing the insulation dielectric layer: removing the sacrificing layers; forming a resistive function layer and a top electrode of a respective one of the vertical ring-shape resistive cells at each position where the sacrificing layer has been removed; and etching back to isolate the vertical ring-shape resistive cells.

Optionally, the method may further comprise: in the step B, before removing the sacrificing layers, performing word-line etching of the first storage sub-array; and in the step C, before removing the sacrificing layers, performing word-line etching of the second storage sub-array, which stops at the insulation dielectric layer of the first storage sub-array.

Optionally, the method may further comprise, in the step C, before removing the sacrificing layers, performing word-line etching of a plurality of the storage sub-arrays simultaneously. For example, the word-line etching of the first storage sub-array and the second storage sub-array may be performed simultaneously.

Optionally, the method may further comprise, in the step C, before depositing the insulation dielectric layer and after performing the Word-line etching of the plurality of the storage sub-arrays: removing the sacrificing layers formed in the step B and the step C; forming a resistive function layer and a top electrode of a respective one of the vertical ring-shape resistive cells at each position where the sacrificing layer has been removed; and etching back to isolate the vertical ring-shape resistive cells.

Optionally, the access transistor may be selected from a group consisting of: a planar transistor, a FinFET, and a vertical gate-all-around transistor.

Optionally, the vertical gate-all-around transistor may comprise: a source region being formed on the substrate; a channel region being formed on the source region and vertical to the substrate; a drain region being formed between the channel region and the vertical ring-shape resistive cell; and a gate insulation layer and a gate being formed in sequence along peripheral side of the channel region.

Optionally, the vertical ring-shape resistive cells may comprise one or more ring-shape resistance cells being arranged along a longitudinal direction, wherein each of the ring-shape resistance cells comprises: a bottom electrode being formed on the drain of a corresponding vertical gate-all-around transistor or the bottom electrode of corresponding vertical ring-shape resistive cells of a lower storage sub-array, wherein the one or more ring-shape resistance cells corresponding to the same vertical gate-all-around transistor shares the bottom electrode; a resistive function layer being formed along peripheral side of the bottom electrode and configured for distinguishing information states; and a top electrode being formed on the resistive function layer, wherein: respective top electrodes of different layers of the vertical ring-shape resistive cells are insulated from each other; and respective top electrodes of adjacent ring-shape resistance cells are isolated from each other in a bit-line direction, and share a connection to external of the storage sub-array in a word-line direction.

(III) Beneficial Effects

According to the present disclosure, the vertical ring-shape resistive cells share a same bottom electrode. A storage array is divided into a plurality of storage sub-arrays. As a result, the via of each storage sub-array can be etched respectively, which is different from the prior art, where a via for a bottom electrode of a plurality of layers of resistive cells is etched at one time. That is, vias with small etching dimensions can be etched at multiple times, while other regions that need etching can be processed flexibly as appropriate.

DETAILED DESCRIPTION OF EMBODIMENTS

Figure 1:
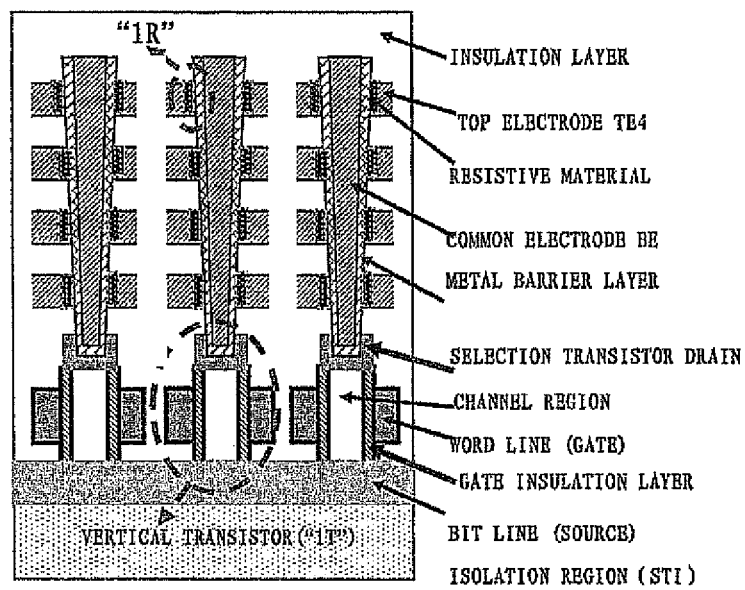
FIG. 1 shows a cross-sectional view along a bit-line direction of a 1T1R-type three-dimensional memory structure proposed by the applicant.
Figure 2:
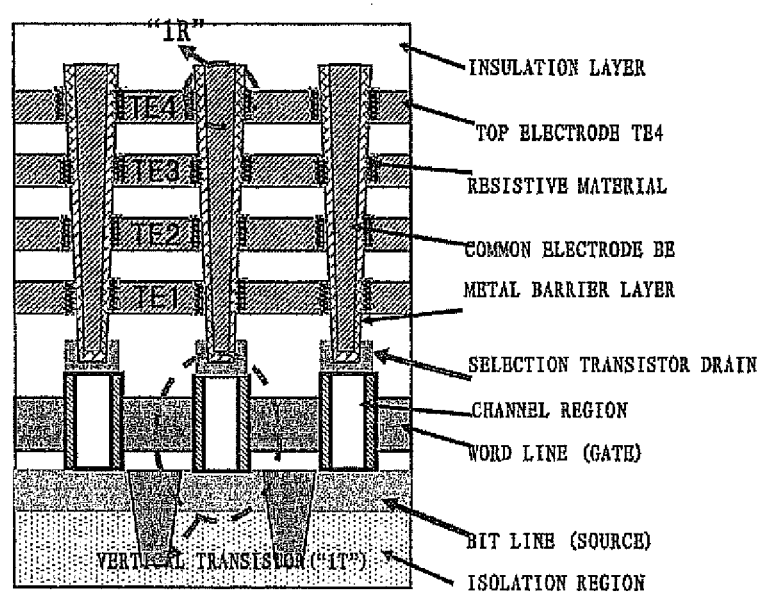
FIG. 2 shows a cross-sectional view along a word-line direction of a 1T1R-type three-dimensional memory structure proposed by the applicant.

Next, the present disclosure will be more specifically explained in connection with specific embodiments and with reference to the drawings, whereby objects, solutions, and advantages of the present disclosure will become more apparent.

The present disclosure provides a method for manufacturing a three-dimensional semiconductor memory device, comprising:
  step A: forming an access transistor on a substrate;
  step B: forming a first storage sub-array comprising a plurality of vertical ring-shape resistive cells on the access transistor, comprising:
    step B1: depositing a plurality of isolation layers and a plurality of sacrificing layers, alternatively;
    step B2: etching a via to define a bottom electrode region of the vertical ring-shape resistive cells, the bottom electrode region being connected downward with a drain of the access transistor;
    step B3: depositing a bottom electrode of the first storage sub-array in the via; and
    step B4: depositing an insulation dielectric layer;
  step C: forming a second storage sub-array comprising a plurality of vertical ring-shape resistive cells on the first storage sub-array, comprising:
    step C1: depositing a plurality of isolation layers and a plurality of sacrificing layers;
    step C2: etching a via to define a bottom electrode region, which extends downward to the bottom electrode of the first storage sub-array;
    step C3: depositing a bottom electrode of the second storage sub-array in the via, wherein the bottom electrode of the second storage sub-array is connected with the bottom electrode of the first storage sub-array; and
    step C4: depositing an insulation dielectric layer.

The method may further comprise, after the step C: repeating the step C to form an Nth storage sub-array on an (N−1)th storage sub-array. The method may further comprise, before the step B: determining a number of layers of the vertical ring-shape resistive cells based on a ratio between depth and diameter of the via and a height of each vertical ring-shape resistive cell; and determining a number of the sacrificing layers based on the number of layers of the vertical ring-shape resistive cells.

According to the present disclosure, a plurality of vertical resistive (phase-change) cells share one bottom electrode. A whole storage array is divided into a plurality of storage sub-arrays. As a result, the via of each storage sub-array can be etched respectively, which is different from the prior art, where a via for a bottom electrode of a plurality of layers of resistive cells is etched at one time. For each storage sub-array, the resistive (phase-change) function layers and the top electrodes are manufactured, respectively. Then connections between the storage sub-arrays are manufactured by etching bottom electrode vias and metal filling process, so as to form the whole storage array. For each storage sub-array, etching depth can be determined based on a ratio between depth and diameter of the via, whereby a number of layers of the resistive cells to be deposited can be determined. After the number of layers have been integrated, a further storage stack is deposited and processes such as etching are performed. The procedure is repeated until a number of layers of the whole storage array required for ultra-high density integration is obtained.

Figures 3, 4:
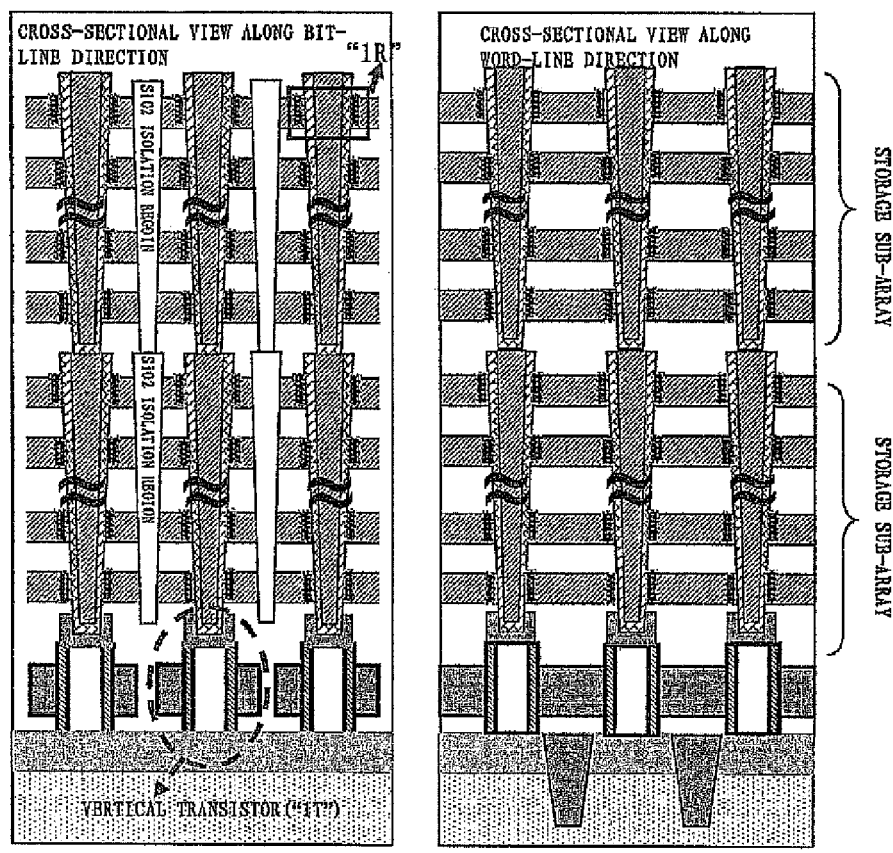
FIG. 3 shows a comparison between a whole stack height obtained when a via has a top diameter of 100 nm, a bottom diameter of 30 nm, and an etching angle of 85 degree and a whole stack height obtained when a via has a top diameter of 100 nm, a bottom diameter of 0 nm, and an etching angle of 85 degree.
FIG. 4 shows cross-sectional views of a three-dimensional semiconductor memory device that is manufactured according to a method of the present disclosure along a word-line and a bit-line, respectively.

FIG. 4 shows cross-sectional views of a three-dimensional semiconductor memory device that is manufactured according to a method of the present disclosure along a word-line and a bit-line, respectively. As shown in FIG. 4, a transistor and a storage array at a lower portion are first integrated. Then a further storage stack is deposited and a via is etched. The via etching stops at bottom electrode metal material of the pre-formed via. Then metal material is deposited at an upper portion and is connected with the metal material at the lower portion. Similarly, word-line etching process for insulating vertical storage strings along the bit-line is performed at the upper portion. The etching stops at a silicon dioxide insulation layer at the lower portion. Then a silicon dioxide insulation layer at the upper portion is deposited in the etching region to complete respective isolations between the storage strings at the upper portion.

As shown in FIG. 4, a three-dimensional resistive (phase-change) storage array structure formed by this procedure comprises:

1. Selection transistors. The selection transistor may be of various types. For example, it may be a planar-type transistor such as a FinFET or a vertical-type transistor. The selection transistor provides current limiting function to erasing/writing of the resistive (phase-change) cells and enable selective access to the resistive cells.

2. A stack-type resistive (phase-change) cell array. The storage array comprises a plurality of storage sub-array groups, each storage sub-array group comprising an array of vertical resistive cell strings, each vertical resistive cell string being formed in an etching depth range that can be achieved. Each vertical ring-shape resistive cell may comprise:

(2A) A bottom electrode. For each vertical resistive cell string, the resistive cells share a bottom electrode connected to a drain of the access transistor associated with this string. The bottom electrode may comprise a single layer of metal or a dual-layer structure comprising a metal passivation layer and a metal layer. The bottom electrode may comprise a material selected from a group consisting of Ag, Au, Cu, W, Ti, Pt, Ti, and Ta, etc. The bottom electrode may also comprise a material selected from a group consisting of TiN, TaN, and WN, etc.

(2B) A resistive function layer. This layer is formed surrounding the pillar-shape bottom electrode to form a ring-shape structure. The function layer may provide a capability of distinguishing information states. (1) the function layer may be formed by depositing a single layer of resistive material or multiple layers of resistive materials, as in a conventional resistive memory. For example, the resistive function layer may comprise a complex oxide, such as $Pr_{1-x}Ca_xMnO_3$ ($0<=x<=1$), etc. Alternatively, the resistive function layer may comprise a Perovskite material such as $SrTiO_3$ or $SrZrO_3$, etc., or a binary transition metal oxide selected from a group consisting of $HfO_2$, $CuO_2$, $TiO_2$, $ZrO_2$, $NiO_x$, ($0<x<=2$), $Nb_2O_5$, and MoO, etc. The resistive function layer may also comprise a combination of the foregoing materials. (2) Resistance states can be switched by changing the phase of the function layer material, as in a conventional phase-change memory. The function layer may comprise a phase-changeable material, such as one selected from a group consisting of $Ge_2Sb_2Te_3$ (GST), GeTe, and GeTeC, etc.

(2C) A top electrode. Respective top electrodes in the vertical storage cell string are insulated from each other. Respective top electrodes of the strings in a bit-line direction are also insulated from each other. Respective top electrodes of the strings in a word-line direction share a connection to external of the array. The top electrode may comprise a single layer or two layers of metal. For example, the top electrode may comprise a material selected from a group consisting of Ag, Au, Cu, W, Ti, Pt, Ti, and Ta, etc. The top electrode may also comprise a material selected from a group consisting of TiN, TaN, and WN, etc. The top electrode may also be a combination of the foregoing materials.

Figure 5:
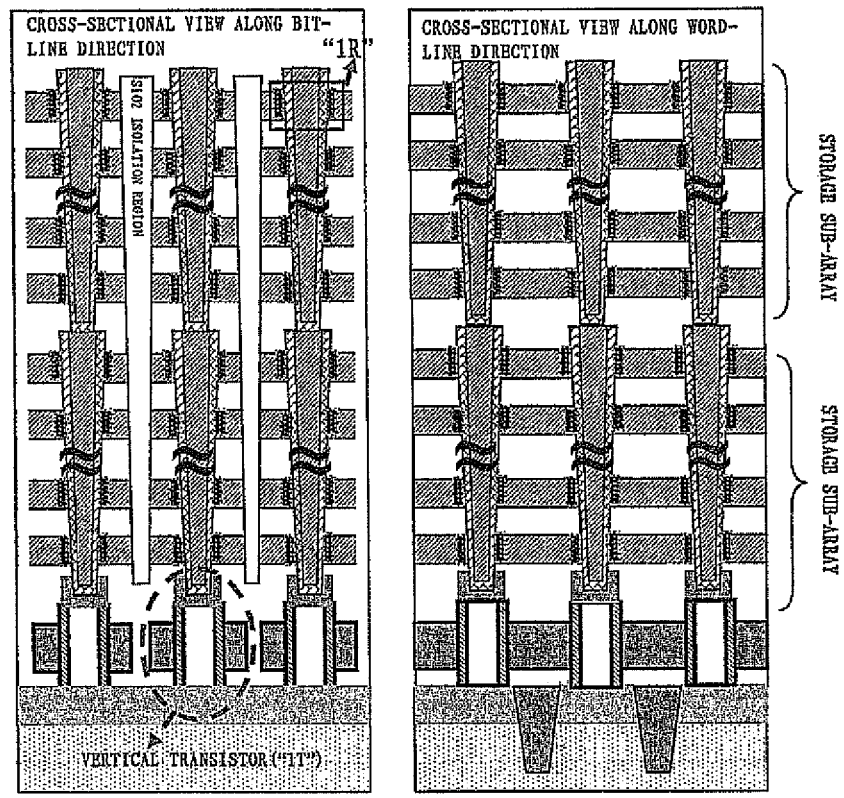
FIG. 5 shows cross-sectional views of a three-dimensional semiconductor memory device that is manufactured according to a method of the present disclosure along a word-line and a bit-line, respectively, wherein vias are formed by multiple times of etching, and word-line isolations are formed by one time of etching.

The structure shown in FIG. 4 is formed by multiple etching steps performed for the bottom electrode vias and the word-line isolations. Alternatively, a trade-off solution can be adopted, where the bottom electrode vias are formed by multiple etching steps, and the word-line isolations are formed by one etching step, as shown in FIG. 5.

The storage array may be manufactured by various manufacturing processes. A simple embodiment is provided as below. FIG. 6-FIG. 15 are schematic views showing respective steps in a method for manufacturing a three-dimensional semiconductor memory device according to embodiments of the present disclosure. The present disclosure will be specifically described With reference to FIG. 6-FIG. 15.

Assuming that a top electrode of a storage array cell has a thickness of about 50 nm, and an insulation layer between the cells has a thickness of about 60 nm. In order to prevent formation of "hollow holes" during filling the bottom electrode and variation of resistance of metal wires, for a via having a top diameter of about 100 nm, its bottom diameter must be larger than about 30 nm. In order to reduce the difficulty of etching process, it is assumed that an etching angle for multiple layers of materials is 85 degree. Therefore, a stack satisfying the foregoing requirements has a thickness of about 400 nm. In other words, a required storage sub-array comprises four layers, i.e., each storage sub-array comprises four resistive cells.

In order to manufacture a stack comprising twelve layers of resistive cells, three (=12/4) distinct storage sub-arrays need to be formed. The process is as follows.

Figure 6:
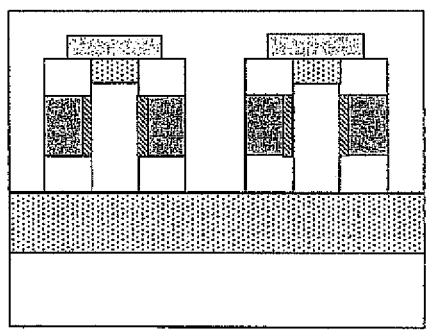
FIG. 6 shows a schematic view of a structure obtained after manufacturing vertical gate-all-around transistors in a method for manufacturing a three-dimensional semiconductor memory device according to an embodiment of the present disclosure.

Step S1. A vertical gate-all-around transistor is manufactured. A structure obtained after this step is shown in FIG. 6. A channel region of the vertical transistor may have a silicon channel being formed by etching a silicon substrate. Optionally, the channel region may be a silicon channel, a germanium channel, or a germanium-silicon channel being formed by epitaxy. Optionally, the channel region may be a polysilicon channel being formed by polysilicon deposition or amorphous silicon deposition followed by high-temperature anneal. A source region may be formed by ion implantation before or after the channel region is formed. A drain region may be formed by ion implantation. A gate dielectric may be $SiO_2$ or a high-K material (e.g., $HfO_2$ or $Al_2O_3$) or a combination thereof. An electrode may comprise one of polysilicon, metal, metal silicide, and metal nitride, or a combination thereof.

Figure 7:
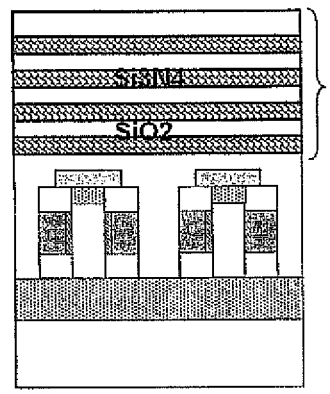
FIG. 7 shows a schematic view of a structure obtained after manufacturing sacrificing layers of respective first storage sub-arrays in the method for manufacturing the three-dimensional semiconductor memory device according to an embodiment of the present disclosure.

Step S2. A stack comprising dielectric materials with different etching selectivities, e.g., $SiO_2/Si_3N_4/SiO_2/\ldots/Si_3N_4/SiO_2$, is deposited by, e.g., CVD. A structure obtained after this step is shown in FIG. 7.

Figure 8:
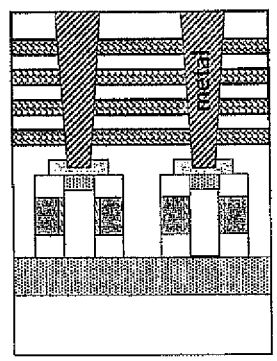
FIG. 8 shows a schematic view of a structure obtained after etching respective vias in the first storage sub-arrays and filling metal in the vias in the method for manufacturing the three-dimensional semiconductor memory device according to an embodiment of the present disclosure.

Step S3. A deep via is formed in the stack by dry etching or dry etching in combination with wet etching. Then one or more layers of metal are deposited in the deep via by sputtering or evaporation to form an electrode of the storage cell. A structure obtained after this step is shown in FIG. 8.

Figure 9:
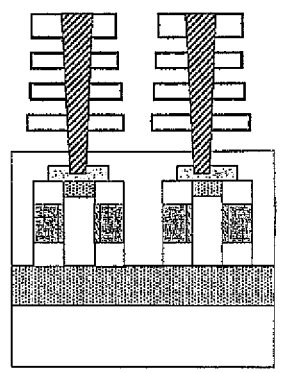
FIG. 9 shows a schematic view of a structure obtained after etching in the word-line direction and removing SiN sacrificing layers in the method for manufacturing the three-dimensional semiconductor memory device according to an embodiment of the present disclosure.

Step S4. The stack is etched in a word-line direction by dry etching or dry etching in combination with wet etching. Then $Si_3N_4$ is removed by utilizing the different etching selectivities of $Si_3N_4$ and $SiO_2$. A structure obtained after this step is shown in FIG. 9.

Figure 10:
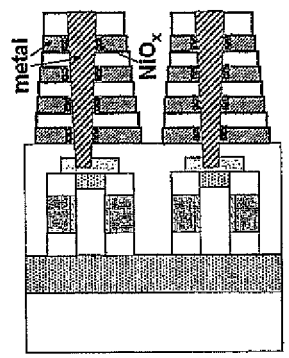
FIG. 10 shows a schematic view of a structure obtained after depositing resistive regions and top electrodes and isolating cells by etching back in the method for manufacturing the three-dimensional semiconductor memory device according to an embodiment of the present disclosure.

Step S5. A resistive material (e.g., $HfO_2$ or NiO) or a phase-change material (e.g., GST) is deposited by, e.g., CVD or ALD. One or more layers of metal are deposited by, e.g., sputtering or evaporation to form another electrode of the storage cell. Then the metal and the function layer material are removed by dry etching in isolation regions to isolate the storage cells. A structure obtained after this step is shown in FIG. 10.

Figure 11:
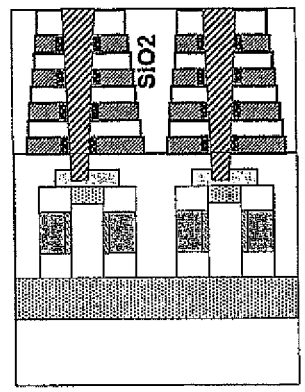
FIG. 11 shows a schematic view of a structure obtained after forming the first storage sub-arrays in the method for manufacturing the three-dimensional semiconductor memory device according to an embodiment of the present disclosure.

Step S6. An insulation layer (e.g., $SiO_2$) is deposited by, e.g., CVD. Then a first storage sub-array is formed. A structure obtained after this step is shown in FIG. 11.

Figure 12:
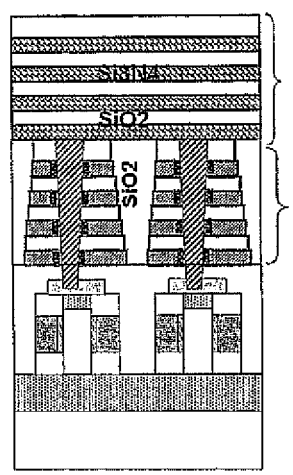
FIG. 12 shows a schematic view of a structure obtained after depositing sacrificing layers of respective second storage sub-arrays in the method for manufacturing the three-dimensional semiconductor memory device according to an embodiment of the present disclosure.

Step S7. Similarly as the step S2, multiple dielectric layers of a second storage sub-array are deposited. A structure obtained after this step is shown in FIG. 12.

Figure 13:
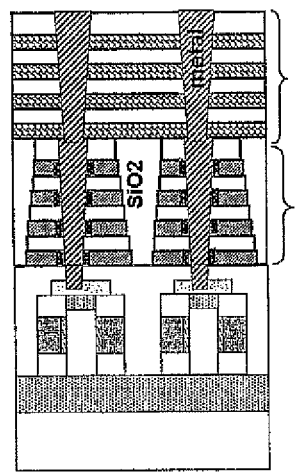
FIG. 13 shows a schematic view of a structure obtained after etching and filling respective vias of the second storage sub-arrays so as to connect each of the vias with a respective one of the first storage sub-arrays in the method for manufacturing the three-dimensional semiconductor memory device according to an embodiment of the present disclosure.

Step S8. Similarly as the step S3, a via is etched for the second storage sub-array and is filled to be connected with the first storage sub-array. A structure obtained after this step is shown in FIG. 13.

Figure 14:
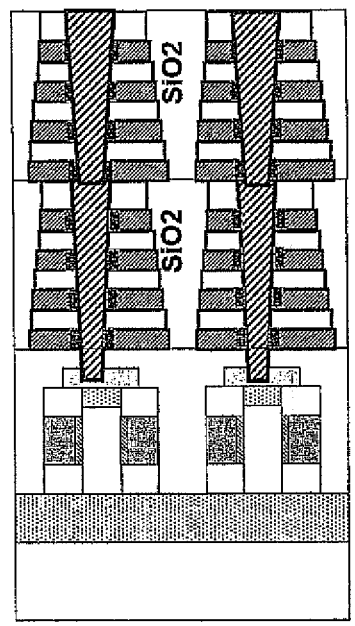
FIG. 14 shows a schematic view of a structure obtained after forming respective resistive regions, top electrodes, and isolation regions of the second storage sub-arrays in the method for manufacturing the three-dimensional semiconductor memory device according to an embodiment of the present disclosure.

Step S9. Resistive regions, top electrodes, and isolation regions of the second storage sub-array are formed in a similar manner as the first storage sub-array. A structure obtained after this step is shown in FIG. 14.

Figure 15:
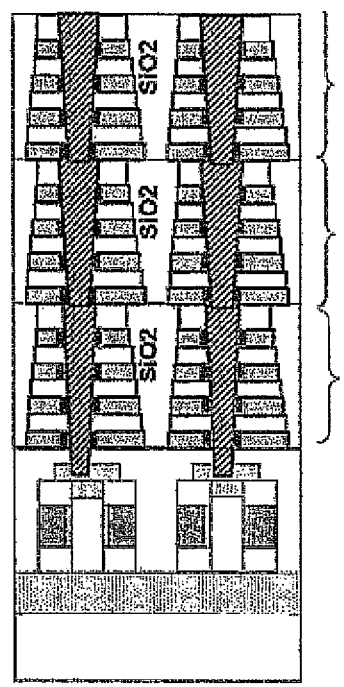
FIG. 15 shows schematic view of a structure obtained after forming third storage sub-arrays in the method for manufacturing the three-dimensional semiconductor memory device according to an embodiment of the present disclosure.

Step S10. A third storage sub-array is formed in a similar manner as the second storage sub-array. A structure obtained after this step is shown in FIG. 15.

From the foregoing process flow it can be seen that the high-density multi-stack (12 layers of cells) storage array can be manufactured by integrating a plurality of storage sub-arrays in sequence. Each storage sub-array can be manufactured by low-temperature process, and therefore the process has a small effect on the performance of the pre-formed device. Although process steps are increased, requirements on key processes, such as etching and filling, are reduced, and thus the structure is easier to be implemented. The array is more reliable and a high-density storage array of more layers can be implemented.

One of ordinary skill in the art will understand that in the foregoing manufacturing method, for each storage sub-array, a via is etched and word-line etching is performed to form isolation regions. Furthermore, in the manufacturing method, the storage function layers and the top electrodes may not be formed after the via of each storage sub-array is etched and filled. Instead, after all sub-arrays are formed, the whole storage array is etched at one time and then function layers and top electrodes of the resistive cells are deposited. After that, insulation regions are formed by etching back the top electrodes. Finally, an insulation layer is deposited in the etched regions to form isolation regions in a bit-line direction. That is, the vias having small etching dimensions are etched in multiple times. However, the isolation regions having large dimensions are etched in one time, as shown in FIG. 5. Furthermore, in the foregoing example, it is assumed that each resistive cell has a satisfying layer with a thickness of about 100 nm and an etching angle of about 85 degree. However, the number of layers of the storage sub-array is not limited thereto. Any implantations based on the foregoing concepts are covered by the present disclosure.

It should be noted that in the method for manufacturing the three-dimensional semiconductor memory device according to the present disclosure, the deposition processes may comprise CVD, LPCVD, ALD, sputtering, and evaporation, etc. The etching processes may comprise dry etching such as RIE and ICP and wet etching. One of ordinary skill in the art may select proper deposition and etching processes as well as other processes according to actual conditions and environmental factors. Any variations that can achieve the object and structural features of the present disclosure should fall within the protection scope of the present disclosure.

In view of the foregoing embodiments, the present disclosure has the following advantageous effects:

1. According to the present disclosure, a whole storage array is divided into a plurality of storage sub-arrays. As a result, the via of each storage sub-array can be etched respectively, which is different from the prior art, where a via for a bottom electrode of a plurality of layers of resistive cells is etched at one time. The respective storage sub-arrays are interconnected with each other by filling metal in the vias. In this way, the process complexity and difficulty of etching process in high-density integration can be substantially reduced, and the number of layers of resistive cells of the whole storage array can be greatly increased.
2. According to the present disclosure, the via of each storage sub-array is etched respectively, whereby top diameter and bottom diameter of the via can be controlled. Large local resistance caused by a small bottom diameter due to performing etching at one time can be avoided.
3. According to the present disclosure, the via is etched and filled with metal for each storage sub-array, respectively. This advantageously avoids generation of hollow holes during filling a deep via. As a result, open circuit in the bottom electrode of the array can be avoided and process difficulty of filling is reduced.
4. Although the etching is performed in multiple times, the process complexity of each etching and filling is substantially reduced. The reliability of device is ensured and this facilitates ultra-high-density integration.

The objects, technical solution and advantageous effects of the present disclosure have been described with reference to the foregoing specific embodiments. However, these are only specific embodiments of the present disclosure and by no means constitute a limitation thereto. Any modification, substitution, and improvements within the spirit and concept of the present disclosure should be covered within the protection scope thereof.

What is claimed is:

1. A method for manufacturing a three-dimensional semiconductor memory device, comprising:
    step A: forming an access transistor on a substrate, wherein the access transistor is selected from a group consisting of: a planar transistor, a FinFET, and a vertical gate-all-around transistor;
    step B: forming a first storage sub-array comprising a plurality of vertical ring-shape resistive cells on the access transistor, comprising:
        depositing a plurality of isolation layers and a plurality of sacrificing layers, alternatively;
        etching a via to define a bottom electrode region of the vertical ring-shape resistive cells, the bottom electrode region being connected downward with a drain of the access transistor;
        depositing a bottom electrode of the first storage sub-array in the via; and
        depositing an insulation dielectric layer;
    step C: forming a second storage sub-array comprising a plurality of vertical ring-shape resistive cells on the first storage sub-array, comprising:
        depositing a plurality of isolation layers and a plurality of sacrificing layers;
        etching a via to define a bottom electrode region, which extends downward to the bottom electrode of the first storage sub-array;
        depositing a bottom electrode of the second storage sub-array in the via, wherein the bottom electrode of the second storage sub-array is connected with the bottom electrode of the first storage sub-array; and
        depositing an insulation dielectric layer.

2. The method for manufacturing the three-dimensional semiconductor memory device according to claim 1, further comprising, after the step C:
    repeating the step C to form an Nth storage sub-array on an (N−1)th storage sub-array.

3. The method for manufacturing the three-dimensional semiconductor memory device according to claim 2, further comprising, before the step B:
    for each storage sub-array, determining a number of layers of the vertical ring-shape resistive cells based on a ratio between depth and diameter of the via and a height of each vertical ring-shape resistive cell; and
    determining a number of the sacrificing layers based on the number of layers of the vertical ring-shape resistive cells.

4. The method for manufacturing the three-dimensional semiconductor memory device according to claim 1, further comprising, in each of the step B and the step C, before depositing the insulation dielectric layer:
    removing the sacrificing layers;
    forming a resistive function layer and a top electrode of a respective one of the vertical ring-shape resistive cells at each position where the sacrificing layer has been removed; and
    etching back to isolate the vertical ring-shape resistive cells.

5. The method for manufacturing the three-dimensional semiconductor memory device according to claim 4, further comprising:
   in the step B, before removing the sacrificing layers, performing word-line etching of the first storage sub-array; and
   in the step C, before removing the sacrificing layers, performing word-line etching of the second storage sub-array, which stops at the insulation dielectric layer of the first storage sub-array.

6. The method for manufacturing the three-dimensional semiconductor memory device according to claim 1, further comprising:
   in the step C, before removing the sacrificing layers, performing word-line etching of a plurality of the storage sub-arrays simultaneously.

7. The method for manufacturing the three-dimensional semiconductor memory device according to claim 6, further comprising, in the step C, before depositing the insulation dielectric layer and after performing the word-line etching of the plurality of the storage sub-arrays:
   removing the sacrificing layers formed in the step B and the step C;
   forming a resistive function layer and a top electrode of a respective one of the vertical ring-shape resistive cells at each position where the sacrificing layer has been removed; and
   etching back to isolate the vertical ring-shape resistive cells.

8. The method for manufacturing the three-dimensional semiconductor memory device according to claim 1, wherein the vertical gate-all-around transistor comprises:
   a source region being formed on the substrate;
   a channel region being formed on the source region and vertical to the substrate;
   a drain region being formed between the channel region and the vertical ring-shape resistive cell; and
   a gate insulation layer and a gate being formed in sequence along peripheral side of the channel region.

9. The method for manufacturing the three-dimensional semiconductor memory device according to claim 8, wherein the vertical ring-shape resistive cells comprises one or more ring-shape resistance cells being arranged along a longitudinal direction, wherein each of the ring-shape resistance cells comprises:
   a bottom electrode being formed on the drain of a corresponding vertical gate-all-around transistor or the bottom electrode of corresponding vertical ring-shape resistive cells of a lower storage sub-array, wherein the one or more ring-shape resistance cells corresponding to the same vertical gate-all-around transistor shares the bottom electrode;
   a resistive function layer being formed along peripheral side of the bottom electrode and configured for distinguishing information states; and
   a top electrode being formed on the resistive function layer, wherein: respective top electrodes of different layers of the vertical ring-shape resistive cells are insulated from each other; and respective top electrodes of adjacent ring-shape resistance cells are isolated from each other in a bit-line direction, and share a connection to external of the storage sub-array in a word-line direction.

* * * * *